United States Patent
Lee et al.

(10) Patent No.: US 7,387,929 B2
(45) Date of Patent: Jun. 17, 2008

(54) CAPACITOR IN SEMICONDUCTOR DEVICE AND METHOD OF MANUFACTURING THE SAME

(75) Inventors: Eun A. Lee, Seoul (KR); Hai Won Kim, Icheon-shi (KR)

(73) Assignee: Hynix Semiconductor Inc., Gyunggi-do (KR)

( * ) Notice: Subject to any disclaimer, the term of this patent is extended or adjusted under 35 U.S.C. 154(b) by 7 days.

(21) Appl. No.: 11/271,601

(22) Filed: Nov. 10, 2005

(65) Prior Publication Data

US 2007/0004164 A1    Jan. 4, 2007

(30) Foreign Application Priority Data

Jun. 30, 2005    (KR) .................. 10-2005-0058768

(51) Int. Cl.
  *H01L 21/8242*    (2006.01)
(52) U.S. Cl. .................. 438/240; 438/241; 438/251; 438/253; 438/255; 438/296; 257/E21.008; 257/E21.011
(58) Field of Classification Search .................. None
See application file for complete search history.

(56) References Cited

U.S. PATENT DOCUMENTS

| | | | |
|---|---|---|---|
| 5,316,982 A * | 5/1994 | Taniguchi | 438/396 |
| 6,744,093 B2 * | 6/2004 | Agarwal et al. | 257/306 |
| 2004/0126983 A1 * | 7/2004 | Kim | 438/396 |
| 2005/0082586 A1 | 4/2005 | Tu et al. | 257/296 |
| 2005/0167725 A1 | 8/2005 | Nagano et al. | 257/309 |
| 2005/0196915 A1 * | 9/2005 | Jeong et al. | 438/238 |

FOREIGN PATENT DOCUMENTS

| | | |
|---|---|---|
| KR | 2002-0039455 | 5/2002 |
| KR | 1020040060443 A | 7/2004 |
| KR | 1020050028749 A | 3/2005 |
| KR | 2005-79308 | 8/2005 |
| KR | 102006001150 A | 1/2006 |

* cited by examiner

*Primary Examiner*—Michael S. Lebentritt
*Assistant Examiner*—Kyoung Lee
(74) *Attorney, Agent, or Firm*—Marshall, Gerstein & Borun LLP

(57) ABSTRACT

The present invention relates to a capacitor in semiconductor device and a method of manufacturing the same, wherein, owing to formation of a lower electrode and an upper electrode into a stack structure of a poly-silicon layer and an aluminum (Al) layer and formation of an alumina ($Al_2O_3$) film as a dielectric film, the lower electrode is formed into a stack structure of the poly-silicon layer-aluminum (Al) layer, thus increasing a surface area of electrodes due to the absence of oxidation during annealing, and preventing degeneration of the device, and use of the dielectric film including a high-dielectric constant material layer enables reduction of the dielectric film's thickness. Accordingly, the present invention is capable of increasing capacitance, is capable of reducing leakage current and improving dielectric breakdown characteristics via internal formation of an MIM capacitor, and is capable of reducing production costs by performing a continuous process via use of a single piece of equipment.

9 Claims, 3 Drawing Sheets

CAPACITOR IN SEMICONDUCTOR DEVICE AND METHOD OF MANUFACTURING THE SAME

BACKGROUND OF THE INVENTION

1. Field of the Invention

The present invention relates to a capacitor in semiconductor device and a method of manufacturing the. More specifically, the present invention relates to a capacitor in semiconductor device and method of manufacturing of the same, wherein an alumina ($Al_2O_3$) film capable of further decreasing the effective thickness is used as a dielectric film, instead of a conventional nitride film, and an aluminum (Al) layer is used as a conductive film, thus enhancing the breakdown voltage of the capacitor and decreasing leakage current leading to improved reliability of the device.

2. Description of the Related Art

Recently, the high degree of integration of semiconductor devices has led to a decrease in cell size, and, as a result, it has become more difficult to fabricate a capacitor having sufficient capacitance. Particularly, in dynamic random access memory (DRAM) devices consisting of a MOS transistor and a capacitor, a crucial factor to achieve high integration of DRAM devices is to increase capacitance of the capacitor occupying a large area in a chip while reducing such an area.

In this connection, the capacitor primarily employs poly-silicon as a conductive material, and an oxide film, a nitride film or a lamination film thereof, namely an oxide-nitride-oxide (ONO) film as a dielectric material. Therefore, as methods to increase capacitance (C) of the capacitor, as given by $C=(\epsilon_0 \times \epsilon_r \times A)/T$ wherein $\epsilon_0$ represents permittivity of vacuum, $\epsilon_r$ represents a dielectric constant of a dielectric film, A represents the surface area of a capacitor, and T represents the thickness of a dielectric film, there may be exemplified a method involving utilization of a material having a high dielectric constant as a dielectric substance, a method of forming a dielectric film with a low thickness, or a method entailing increasing a surface area of the capacitor.

However, such methods suffer from problems and disadvantages. That is, a great deal of research has been focused on dielectric substances having a high dielectric constant, for example, tantalum oxide ($Ta_2O_5$), titanium oxide ($TiO_2$) and strontium titanate ($SrTiO_3$), but it is difficult to apply these materials to practical devices due to the absence of solid confirmation of reliability such as breakdown voltage and thin film characteristics. In addition, decreasing the thickness of the dielectric film results in destruction thereof during operation of the device, this, in turn, significantly affects reliability of the capacitor.

Additionally, a method of increasing a surface area of a lower electrode of the capacitor by forming a poly-silicon layer into multi-layers and then forming the resulting multi-layers into a fin structure connecting each layer therethrough, or a method of increasing a height of the capacitor such as formation of a cylinder-shaped lower electrode on an upper part of a contact suffers from difficulty of subsequent processes due to a step caused by increased height of the capacitor, and high integration of DRAMs leads to a decreased area of the device, thus making it difficult to secure sufficient capacitance of the capacitor.

In addition, since current designs call for twice the number of cells per bit line as in the conventional art, in order to increase cell efficiency, capacitance of the cell capacitor should be further increased, whereas an available surface area of the capacitor is decreased. Therefore, in currently available fin type or cylinder type capacitors, the effective surface area of the capacitor is increased by increasing the height of the capacitor, decreasing the gap between low electrodes, or utilizing hemi-spherical silicon grains.

FIGS. 1a and 1b are views illustrating a capacitor of a semiconductor device in accordance with a conventional art.

First, referring to FIG. 1a, lower structures such as element-isolation oxide films, MOSFET and bit lines are formed on a semiconductor substrate, although they are not shown in FIG. 1a. Next, a lower electrode 12 made of poly-silicon layer pattern is formed on the semiconductor substrate 10 having a contact plug for the lower electrode formed over the entire surface of the resulting lower structures, and an oxide film formed on the surface of the lower electrode 12 is removed by a pre-cleaning process using an HF solution.

Next, a nitride film, as a dielectric film 16, is formed on the surface of the lower electrode 12 via low-pressure chemical vapor deposition (LPCVD) and thermal oxidation is then carried out. As a result, an oxide film 14 made of silicon dioxide ($SiO_2$) is formed between the nitride film 16 and poly-silicon layer 12, and a $SiO_xN_y$ film 18 is formed on the nitride film 16. Herein, the nitride film 16 can be changed into a SiOxNy material.

Next, referring to FIG. 1b, an upper electrode 20 made of poly-silicon material is formed on the SiOxNy film 18, thereby forming a capacitor having a semiconductor-insulator-semiconductor (SIS) structure.

In such a method of manufacturing a capacitor of a semiconductor device in accordance with a conventional art, the capacitor having the SIS structure is formed wherein the lower electrode 12 and upper electrode 20 are formed of poly-silicon layers, and a nitride film is used as a dielectric film 16. Meanwhile, as a design rule is reduced, the cell area is also decreased, and in order to secure sufficient capacitance, an effective thickness of the dielectric film 16 should be decreased. However, if the effective thickness of the nitride film is reduced to less than 40 Å, oxidation resistance thereof is sharply decreased, which results in problems such as oxidization of lower structures including lower electrode 12 and bit lines during a subsequent thermal oxidation process, increased leakage current of the capacitor itself and attenuation of breakdown voltage.

Further, as the upper/lower electrodes are formed of poly-silicon layers, there are additional problems such as degeneration of electrodes, and formation of oxide films on the dielectric film and electrode interfaces thus increasing the effective thickness of the oxide film and then decreasing capacitance.

SUMMARY OF THE INVENTION

Therefore, the present invention has been made in view of the above problems, and it is an object of the present invention to provide a capacitor in semiconductor device and method of manufacturing of the same, capable of easily securing capacitance of the capacitor, decreasing leakage current, and increasing breakdown voltage, thereby improving process yield and reliability of device operation, via use of an alumina ($Al_2O_3$) film having a high dielectric constant as a dielectric film of a capacitor and use of an aluminum (Al) layer as an electrode.

In accordance with an aspect of the present invention, the above and other objects can be accomplished by the provision of a method of manufacturing a capacitor of a semiconductor device, comprising:

forming a lower electrode including a stack structure of a poly-silicon layer and a first aluminum layer on a semiconductor substrate having a lower electrode contact plug formed thereon (step 1);

forming a dielectric film including a high-dielectric constant material layer on the lower electrode (step 2); and forming an upper electrode including a second aluminum layer on the dielectric film (step 3).

In the present invention, the poly-silicon layer may be formed into a doped silicon layer, an undoped silicon layer or a stack structure of doped/undoped silicon layer.

Preferably, the poly-silicon layer is formed using an undoped poly-silicon layer as a seed and subjecting it to vacuum annealing.

Preferably, the poly-silicon layer is subjected to wet or dry pre-cleaning prior to forming the first aluminum layer of the lower electrode.

The dielectric film is preferably formed via use of chemical vapor deposition (CVD), atomic layer deposition (ALD) or plasma-enhanced atomic layer deposition (PEALD)

The method of the present invention may further include annealing via plasma annealing, rapid annealing or furnace annealing, under ammonia ($NH_3$) or nitrogen ($N_2$) gas atmosphere, prior to forming the dielectric film.

After forming the dielectric film, annealing is preferably carried out at a temperature of 400 to 1,000° C. under ammonia ($NH_3$), nitrogen ($N_2$) or argon (Ar) gas atmosphere.

The upper electrode may include a stack structure of the second aluminum layer/poly-silicon layer.

The dielectric film is preferably formed of an aluminum film, a hafnium oxide film or a tantalum oxide film.

In steps 1 through 3, at least two steps are preferably carried out in situ.

In accordance with another aspect of the present invention, there is provided a capacitor of a semiconductor device, comprising:

a semiconductor substrate having lower structures including a transistor and bit lines formed thereon;

a lower electrode including a stack structure of a poly-silicon layer and a first aluminum layer formed on the semiconductor substrate;

a dielectric film including a high-dielectric constant material layer formed on the lower electrode; and an upper electrode including a second aluminum layer formed on the dielectric film.

In the present invention, the poly-silicon layer may be formed into a doped silicon layer, an undoped silicon layer or a stack structure of doped/undoped silicon layer.

The poly-silicon layer may be formed of metastable poly-silicon (MPS).

The dielectric film may be formed of an alumina film, a hafnium oxide film or a tantalum oxide film.

The dielectric film may further include an aluminum nitride (AlN).

The upper electrode may include a stack structure of the second aluminum layer and poly-silicon layer.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Hereinafter, a capacitor in semiconductor device and a method of manufacturing the same in accordance with the present invention will be described in more detail with reference to the accompanying drawings.

Figure 1A:
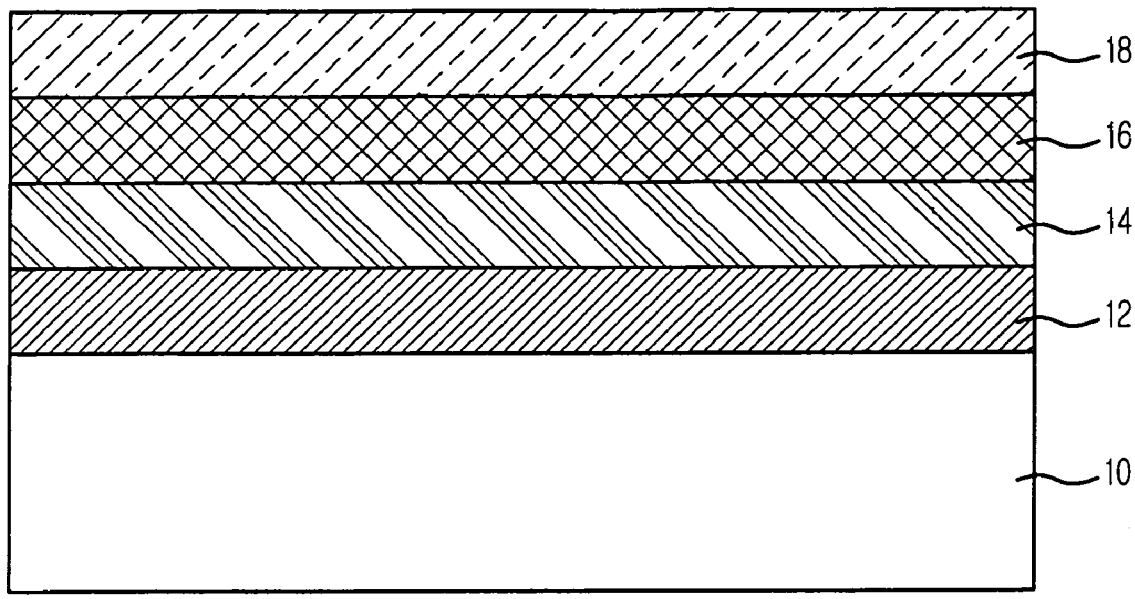
FIGS. 1a and 1b are views illustrating a capacitor of a semiconductor device in accordance with a conventional art.
Figure 1B:
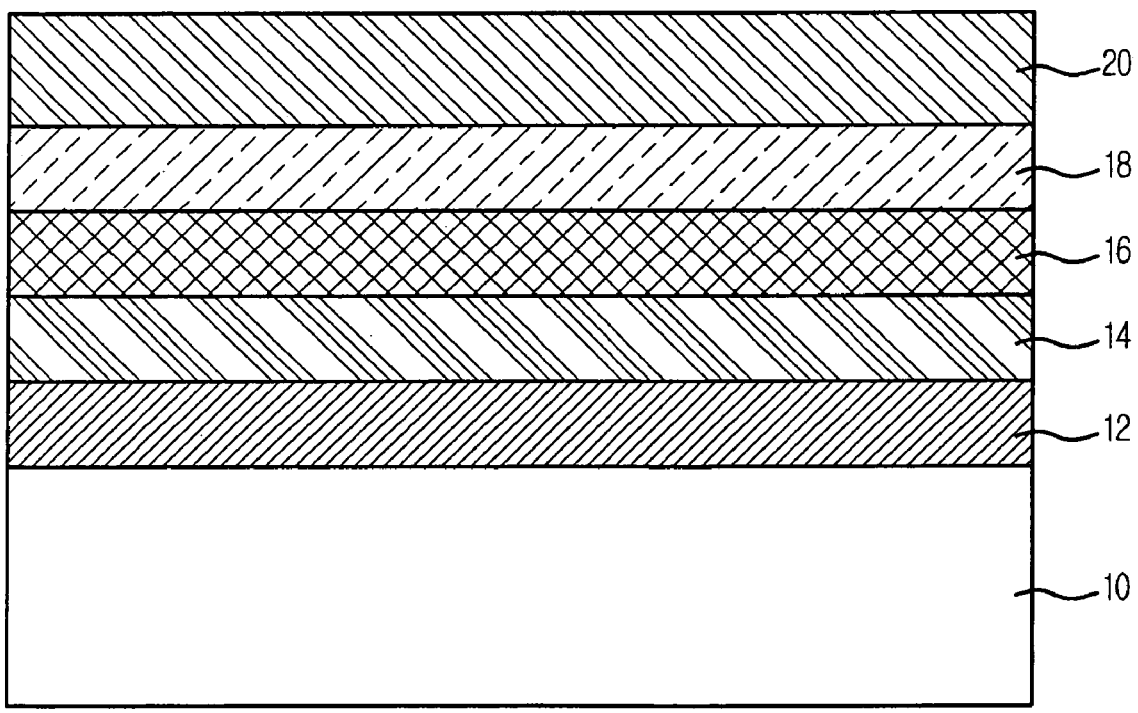
Figure 2A:
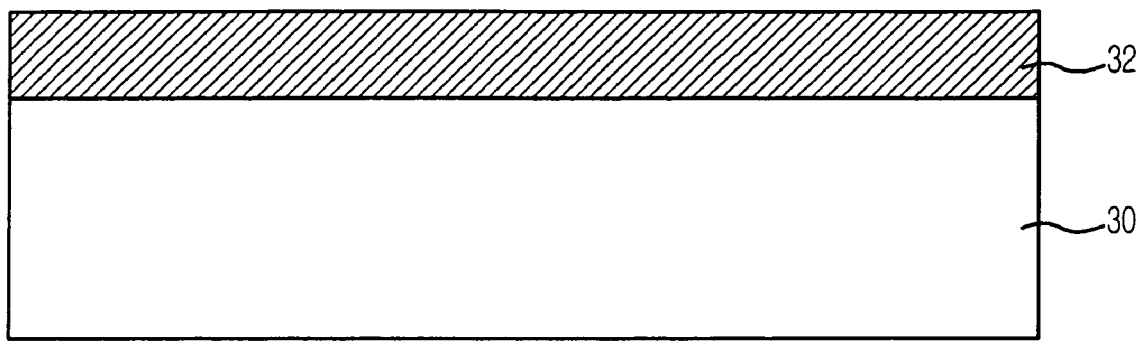
FIGS. 2a through 2c are views illustrating a capacitor in semiconductor device and a method of manufacturing the same in accordance with the present invention.
Figure 2B:
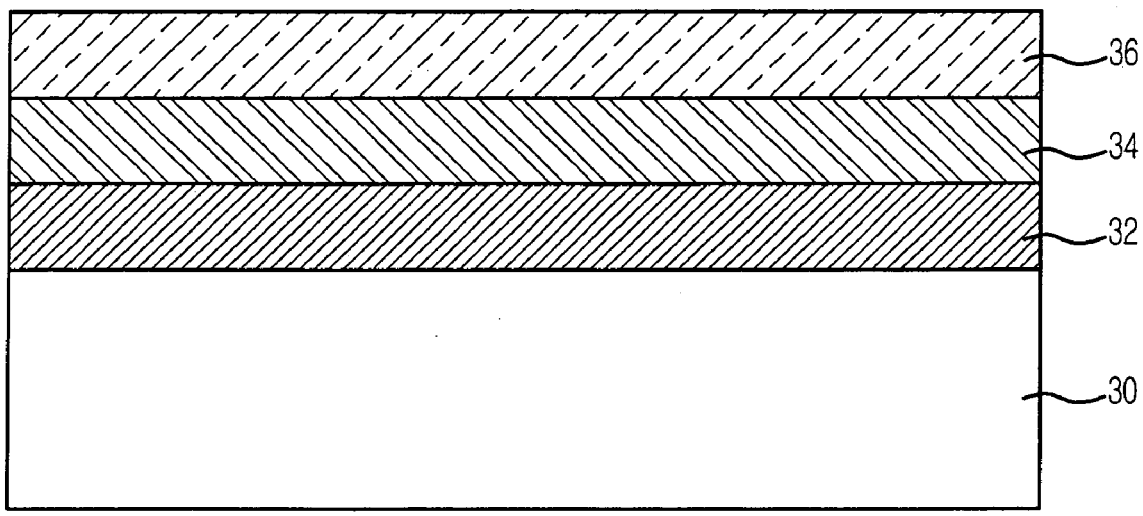
Figure 2C:
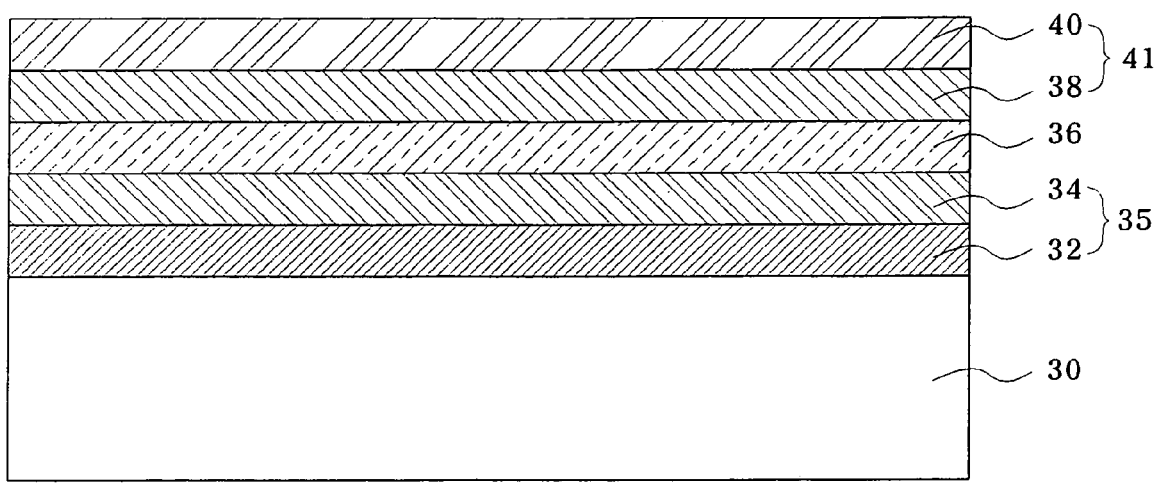

FIGS. 2a through 2c show a process flow chart for a capacitor in semiconductor device and a method of manufacturing the same in accordance with the present invention.

First, referring to FIG. 2a, lower structures such as element-isolation oxide films defining an active layer, MOSFET and bit lines are formed on a semiconductor substrate, although they are not shown in FIG. 2a. Next, a contact plug for the lower electrode is formed on the entire surface of the resulting structure. A first poly-silicon layer 32 for the lower electrode is formed on a semiconductor substrate 30 including the lower structures and the contact plug for the lower electrode. Herein, the first poly-silicon layer 32 may be deposited in the form into a doped silicon layer, an undoped silicon layer or a stack structure of doped/undoped silicon layer through low-pressure chemical vapor deposition (LPCVD). In addition, an undoped poly-silicon layer is formed as a seed and subjecting it to vacuum annealing so as to increase the surface area thereof, or may be formed into metastable poly-silicon (MPS) having an irregular surface.

Referring to FIG. 2b, the first poly-silicon layer 32 is subjected to a wet or dry pre-cleaning process using an HF solution, thereby removing an oxide film produced in the course of formation of the first poly-silicon layer 32, and the first aluminum (Al) layer 34 is formed on the first poly-silicon layer 32 via use of conventional methods well known in the art such as chemical vapor deposition (CVD), physical vapor deposition (PVD) and atomic layer deposition (ALD). Then, the first aluminum (Al) layer 34 and first poly-silicon layer 32 are patterned to form the lower electrode 35 including a stack structure of the first poly-silicon layer 32 and first aluminum (Al) layer 34.

In this case, when the lower electrode 35 is formed of a stack structure of the first poly-silicon layer 32 and first aluminum (Al) layer 34 and the first poly-silicon layer 32 is formed of a metastable poly-silicon layer, the surface area of the lower electrode 35 is increased and the negative effects due to the aluminum (Al) layer are eliminated, thereby increasing capacitance.

Next, a dielectric film 36 including a high-dielectric constant material layer is formed on the first aluminum (Al) layer 34. In this case, the dielectric film 36 may be formed of an alumina ($Al_2O_3$) film, a hafnium oxide ($HfO_2$) film or a tantalum oxide ($Ta_2O_5$) film, via use of a conventional method well known in the art such as chemical vapor deposition (CVD), atomic layer deposition (ALD) or plasma-enhanced atomic layer deposition (PEALD). In the present invention, the aluminum ($Al_2O_3$) film will be illustrated by way of example.

In addition, the method of the present invention may include nitriding the surface of the first aluminum (Al) layer 34 by annealing via use of a conventional method well known in the art such as plasma annealing, rapid annealing or furnace annealing, under ammonia ($NH_3$) or nitrogen ($N_2$) gas atmosphere, prior to forming the dielectric film.

Next, the resulting structure is subjected to subsequent annealing at a temperature of 400 to 1,000° C. under ammonia ($NH_3$), nitrogen ($N_2$) or argon (Ar) gas atmosphere, via a conventional method such as rapid annealing or furnace annealing. Consequently, it is possible to prevent an increase in a film thickness due to formation of an oxide film resulting from change of the first aluminum (Al) layer 34 into alumina ($Al_2O_3$) or aluminum nitride (AlN) in the course of an annealing or subsequent annealing process prior to deposition of the dielectric film 36, thereby being capable of lowering the effective thickness ($T_{eff}$) of the dielectric film 36 to less than 25 Å.

Next, referring to FIG. 2c, the upper electrode 41 including the second aluminum (Al) layer 38 is formed on the upper part of the dielectric film 36. Herein, the upper electrode 41 may be formed of a stack structure of the second aluminum (Al) layer 38 and second poly-silicon layer 40 or may be formed of a single film of the second aluminum (Al) layer 38. The second aluminum (Al) layer 38 may be formed by conventional methods such as chemical vapor deposition (CVD), physical vapor deposition (PVD) and atomic layer deposition (ALD).

Meanwhile, among processes involving deposition of the first aluminum (Al) layer 34, nitriding the surface of the first aluminum (Al) layer 34, deposition of the dielectric film 36 and deposition of the second aluminum (Al) layer 38, at least two processes may be carried out in situ, or may be continuously carried out in a cluster under vacuum conditions. As a result, it is possible to simplify the manufacturing process and reduce facility investment. In addition, since an MIM structure of a capacitor is internally formed, leakage current is decreased due to a difference in a work function between aluminum (Al) and alumina ($Al_2O_3$) and breakdown voltage characteristics are also improved.

The capacitor of a semiconductor device manufactured by the above-mentioned method comprises the semiconductor substrate 30 having lower structures including a transistor and bit lines formed thereon; the lower electrode 35 including a stack structure of the poly-silicon layer 32 and the first aluminum layer 34 formed on the semiconductor substrate 30; the dielectric film 36 including a high-dielectric constant material layer formed on the lower electrode 35; and the upper electrode 41 including a second aluminum layer formed on the dielectric film 36. Herein, the dielectric film 36 may further include an aluminum nitride (AlN) (not shown), and the upper electrode 41 may include a stack structure of the second aluminum layer 38 and poly-silicon layer 40.

In the capacitor of a semiconductor device in accordance with the present invention, the lower electrode 35 and upper electrode 41 are formed into a stack structure of the poly-silicon layer-aluminum (Al) layer, thus being capable of increasing the surface area of the capacitor and preventing degeneration of the device. Further, in accordance with the present invention, use of the alumina ($Al_2O_3$) film having a high dielectric constant as the dielectric film 36 enables reduction of the thickness of the insulation film, thus increasing capacitance, internal formation of an MIM capacitor enables reduction of leakage current and improvement of dielectric breakdown characteristics, and use of a single piece of equipment enables a continuous process thus reducing production costs.

As apparent from the above description, a capacitor of a semiconductor device in accordance with the present invention and a method of manufacturing the same are capable of increasing a surface area of the capacitor and preventing degeneration of the device via formation of the lower electrode and upper electrode into a stack structure of the poly-silicon layer-aluminum (Al) layer. Further, the present invention is capable of reducing the thickness of the insulation film via use of the alumina ($Al_2O_3$) film having a high dielectric constant as the dielectric film, thus increasing capacitance, is capable of reducing leakage current and improving dielectric breakdown characteristics via internal formation of an MIM capacitor, and is capable of reducing production costs by ability to perform a continuous process via use of a single piece of equipment.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method of manufacturing a capacitor of a semiconductor device, comprising:
    forming a lower electrode including a stack structure of a first polysilicon layer and a first aluminum layer over a semiconductor substrate having a lower electrode contact plug formed thereon;
    forming a dielectric film including a high-dielectric constant material layer over the lower electrode;
    after forming the dielectric film, annealing the resulting structure at a temperature of 400° C. to 1,000° C. under an ammonia ($NH_3$), a nitrogen ($N_2$) or an argon (Ar) gas atmosphere; and
    forming an upper electrode including a second aluminum layer over the dielectric film.

2. The method according to claim 1, wherein the first polysilicon layer is formed into a doped silicon layer, an undoped silicon layer or a stack structure doped/undoped silicon layer.

3. The method according to claim 1, wherein the first polysilicon layer is formed using an undoped polysilicon layer as a seed and subjecting it to vacuum annealing.

4. The method according to claim 1, wherein the first polysilicon layer is subjected to wet or dry pre-cleaning prior to forming the first aluminum layer of the lower electrode.

5. The method according to claim 1, wherein the dielectric film is formed via use of chemical vapor deposition (CVD), atomic layer deposition (ALD) or plasma-enhanced atomic layer deposition (PEALD).

6. The method according to claim 1, further comprising: annealing via plasma annealing, rapid annealing or furnace annealing, under ammonia ($NH_3$) or nitrogen ($N_2$) gas atmosphere, prior to forming the dielectric film.

7. The method according to claim 1, wherein the upper electrode includes a stack structure of the second aluminum layer and a second polysilicon layer.

8. The method according to claim 1, wherein the dielectric film is formed of an alumina film, a hafnium oxide film or a tantalum oxide film.

9. The method according to claim 1, wherein at least two of forming the lower electrode, forming the dielectric film, and forming the upper electrode are carried out in situ.

* * * * *